(12) United States Patent
Harshfield

(10) Patent No.: US 8,362,625 B2
(45) Date of Patent: *Jan. 29, 2013

(54) CONTACT STRUCTURE IN A MEMORY DEVICE

(75) Inventor: Steven T. Harshfield, Emmett, ID (US)

(73) Assignee: Round Rock Research, LLC, Mt. Kisco, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/323,120

(22) Filed: Dec. 12, 2011

(65) Prior Publication Data

US 2012/0080798 A1     Apr. 5, 2012

Related U.S. Application Data

(63) Continuation of application No. 12/392,886, filed on Feb. 25, 2009, now Pat. No. 8,076,783, which is a continuation of application No. 10/334,999, filed on Dec. 31, 2002, now Pat. No. 7,504,730, which is a continuation of application No. 09/809,561, filed on Mar. 15, 2001, now Pat. No. 6,563,156, which is a continuation-in-part of application No. 09/617,297, filed on Jul. 14, 2000, now Pat. No. 6,440,837.

(51) Int. Cl.
*H01L 23/48* (2006.01)
*H01L 23/52* (2006.01)
*H01L 29/40* (2006.01)

(52) U.S. Cl. ............................... 257/774; 257/E23.067

(58) Field of Classification Search .................. 257/774, 257/E23.067
See application file for complete search history.

(56) References Cited

U.S. PATENT DOCUMENTS

| | | | |
|---|---|---|---|
| 3,241,009 A | 3/1966 | Dewald et al. | |
| 3,423,646 A | 1/1969 | Cubert et al. | |
| 3,602,635 A | 8/1971 | Romankiw | |
| 3,699,543 A | 10/1972 | Neale | |
| 3,796,926 A | 3/1974 | Cole et al. | |
| 3,877,049 A | 4/1975 | Buckley | |
| 3,886,577 A | 5/1975 | Buckley | |
| 4,099,260 A | 7/1978 | Lynes et al. | |
| 4,115,872 A | 9/1978 | Bluhm | |
| 4,174,521 A | 11/1979 | Neale | |
| 4,180,866 A | 12/1979 | Shanks | |
| 4,194,283 A | 3/1980 | Hoffmann | |
| 4,203,123 A | 5/1980 | Shanks | |
| 4,227,297 A | 10/1980 | Angerstein | |
| 4,272,562 A | 6/1981 | Wood | |
| 4,375,644 A | 3/1983 | Mori et al. | |
| 4,420,766 A | 12/1983 | Kasten | |
| 4,433,342 A | 2/1984 | Patel et al. | |

(Continued)

FOREIGN PATENT DOCUMENTS

| | | |
|---|---|---|
| EP | 0117045 A2 | 8/1984 |
| GB | 1319388 A | 6/1973 |

(Continued)

OTHER PUBLICATIONS

Kim and Kim, "Effects of High-Current Pulses on Polycrystalline Silicon Diode with n-type Region Heavily Doped with Both Boron andPhosphorus," J. Appl. Phys., 53(7):5359-5360, 1982.

(Continued)

*Primary Examiner* — Howard Weiss
(74) *Attorney, Agent, or Firm* — Lerner, David, Littenberg, Krumholz & Mentlik, LLP

(57) ABSTRACT

Annular, linear, and point contact structures are described which exhibit a greatly reduced susceptibility to process deviations caused by lithographic and deposition variations than does a conventional circular contact plug. In one embodiment, a standard conductive material such as carbon or titanium nitride is used to form the contact. In an alternative embodiment, a memory material itself is used to form the contact. These contact structures may be made by various processes, including chemical mechanical planarization and facet etching.

8 Claims, 13 Drawing Sheets

U.S. PATENT DOCUMENTS

| | | | |
|---|---|---|---|
| 4,458,260 A | 7/1984 | McIntyre et al. |
| 4,499,557 A | 2/1985 | Holmberg et al. |
| 4,502,208 A | 3/1985 | McPherson |
| 4,502,914 A | 3/1985 | Trumpp et al. |
| 4,569,698 A | 2/1986 | Feist |
| 4,630,355 A | 12/1986 | Johnson |
| 4,641,420 A | 2/1987 | Lee |
| 4,642,140 A | 2/1987 | Noufi et al. |
| 4,666,252 A | 5/1987 | Yaniv et al. |
| 4,677,742 A | 7/1987 | Johnson |
| 4,757,359 A | 7/1988 | Chiao et al. |
| 4,795,657 A | 1/1989 | Formigoni et al. |
| 4,804,490 A | 2/1989 | Pryor et al. |
| 4,809,044 A | 2/1989 | Pryor et al. |
| 4,818,717 A | 4/1989 | Johnson et al. |
| 4,823,181 A | 4/1989 | Mohsen et al. |
| 4,868,616 A | 9/1989 | Johnson et al. |
| 4,876,220 A | 10/1989 | Mohsen et al. |
| 4,876,668 A | 10/1989 | Thakoor et al. |
| 4,881,114 A | 11/1989 | Mohsen et al. |
| 4,892,840 A | 1/1990 | Esquivel et al. |
| 5,144,404 A | 9/1992 | Iranmanesh et al. |
| 5,166,096 A | 11/1992 | Cote et al. |
| 5,166,758 A | 11/1992 | Ovshinsky et al. |
| 5,177,567 A | 1/1993 | Klersy et al. |
| 5,183,781 A | 2/1993 | Nakano |
| 5,216,282 A | 6/1993 | Cote et al. |
| 5,223,448 A | 6/1993 | Su |
| 5,233,217 A | 8/1993 | Dixit et al. |
| 5,278,099 A | 1/1994 | Maeda |
| 5,293,335 A | 3/1994 | Pernisz et al. |
| 5,296,716 A | 3/1994 | Ovshinsky et al. |
| 5,310,693 A | 5/1994 | Hsue |
| 5,335,219 A | 8/1994 | Ovshinsky et al. |
| 5,341,328 A | 8/1994 | Ovshinsky et al. |
| 5,359,205 A | 10/1994 | Ovshinsky |
| 5,363,329 A | 11/1994 | Troyan |
| 5,406,125 A | 4/1995 | Johnson et al. |
| 5,414,271 A | 5/1995 | Ovshinsky et al. |
| 5,429,988 A | 7/1995 | Huang et al. |
| 5,466,637 A | 11/1995 | Kim |
| 5,500,080 A | 3/1996 | Choi |
| 5,510,629 A | 4/1996 | Karpovich et al. |
| 5,529,956 A | 6/1996 | Morishita |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,569,932 A | 10/1996 | Shor et al. |
| 5,578,185 A | 11/1996 | Bergeron et al. |
| 5,596,522 A | 1/1997 | Ovshinsky et al. |
| 5,624,870 A | 4/1997 | Chien et al. |
| 5,648,298 A | 7/1997 | Cho |
| 5,665,625 A | 9/1997 | Sandhu et al. |
| 5,675,187 A | 10/1997 | Numata et al. |
| 5,687,112 A | 11/1997 | Ovshinsky |
| 5,705,430 A | 1/1998 | Avanzino et al. |
| 5,714,768 A | 2/1998 | Ovshinsky et al. |
| 5,714,795 A | 2/1998 | Ohmi et al. |
| 5,728,596 A | 3/1998 | Prall |
| 5,751,012 A | 5/1998 | Wolstenholme et al. |
| 5,780,340 A | 7/1998 | Gardner et al. |
| 5,789,277 A | 8/1998 | Zahorik et al. |
| 5,789,758 A | 8/1998 | Reinberg |
| 5,812,441 A | 9/1998 | Manning |
| 5,814,527 A | 9/1998 | Wolstenholme et al. |
| 5,825,076 A | 10/1998 | Kotvas et al. |
| 5,831,276 A | 11/1998 | Gonzalez et al. |
| 5,841,150 A | 11/1998 | Gonzalez et al. |
| 5,869,843 A | 2/1999 | Harshfield |
| 5,874,756 A | 2/1999 | Ema et al. |
| 5,879,955 A | 3/1999 | Gonzalez et al. |
| 5,920,788 A | 7/1999 | Reinberg |
| 5,970,336 A | 10/1999 | Wolstenholme et al. |
| 5,998,244 A | 12/1999 | Wolstenholme et al. |
| 6,025,220 A | 2/2000 | Sandhu |
| 6,031,287 A | 2/2000 | Harshfield |
| 6,077,729 A | 6/2000 | Harshfield |
| 6,111,264 A | 8/2000 | Wolstenholme et al. |
| 6,114,713 A | 9/2000 | Zahorik |
| 6,117,720 A | 9/2000 | Harshfield |
| 6,137,182 A * | 10/2000 | Hause et al. ................... 257/774 |
| 6,150,253 A | 11/2000 | Doan et al. |
| 6,153,890 A | 11/2000 | Wolstenholme et al. |
| 6,169,028 B1 | 1/2001 | Wang et al. |
| 6,225,142 B1 | 5/2001 | Reinberg |
| 6,429,064 B1 | 8/2002 | Wicker |
| 6,563,156 B2 | 5/2003 | Harshfield |
| 8,076,783 B2 * | 12/2011 | Harshfield ................... 257/774 |
| 2002/0017701 A1 | 2/2002 | Klersy et al. |

FOREIGN PATENT DOCUMENTS

| | | |
|---|---|---|
| JP | 60109266 A | 6/1985 |
| WO | 98/36466 A1 | 8/1998 |

OTHER PUBLICATIONS

Neale and Aseltine, "The Application of Amorphous Materials to Computer Memories" IEEE, 20(2):195-205, 1973.

Pein and Plummer, "Performance of the 3-D Sidewall Flash EPROM Cell," IEEE, 11-14, 1993.

Post and Ashburn, "Investigation of Boron Diffusion in Polysilicon and its Application to the Design of p-n-p Polysilicon Emitter Bipolar Transistors with Shallow Emitter Junctions," IEEE, 38(11):2442-2451, 1991.

Post et al., "Polysilicon Emitters for Bipolar Transistors: A Review and Re-Evaluation of Theory and Experiment," IEEE, 39(7): 1717-1731, 1992.

Post and Ashburn, "The Use of an Interface Anneal to Control the Base Current and Emitter Resistance of p-n-p Polysilicon Emitter Bipolar Transistors," IEEE, 13(8):408-410, 1992.

Rose et al., "Amorphous Silicon Analogue Memory Devices," J. Non-Crystalline Solids, 115:168-170, 1989.

Schaber et al., "Laser Annealing Study of the Grain Size Effect in Polycrystalline Silicon Schottky Diodes," J. Appl. Phys., 53(12):8827-8834, 1982.

Yamamoto et al., "The I-V Characteristics of Polycrystalline Silicon Diodes and the Energy Distribution of Traps in Grain Boundaries," Electronics and Communications in Japan, Part 2, 75(7):51-58, 1992.

Yeh et al., "Investigation of Thermal Coefficient for Polycrystalline Silicon Thermal Sensor Diode," Jpn. J. Appl. Phys., 31(Part 1, No. 2A):151-155, 1992.

Oakley et al., "Pillars—The Way to Two Micron Pitch Multilevel Metallisation," IEEE, 23-29, 1984.

Prince, "Semiconductor Memories," A Handbook of Design, Manufacture, and Application, 2.sub.nd Ed., pp. 118-123.

* cited by examiner

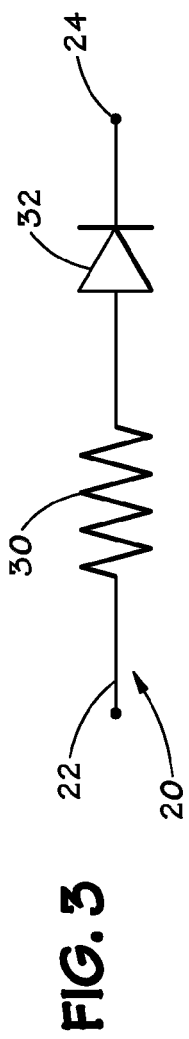
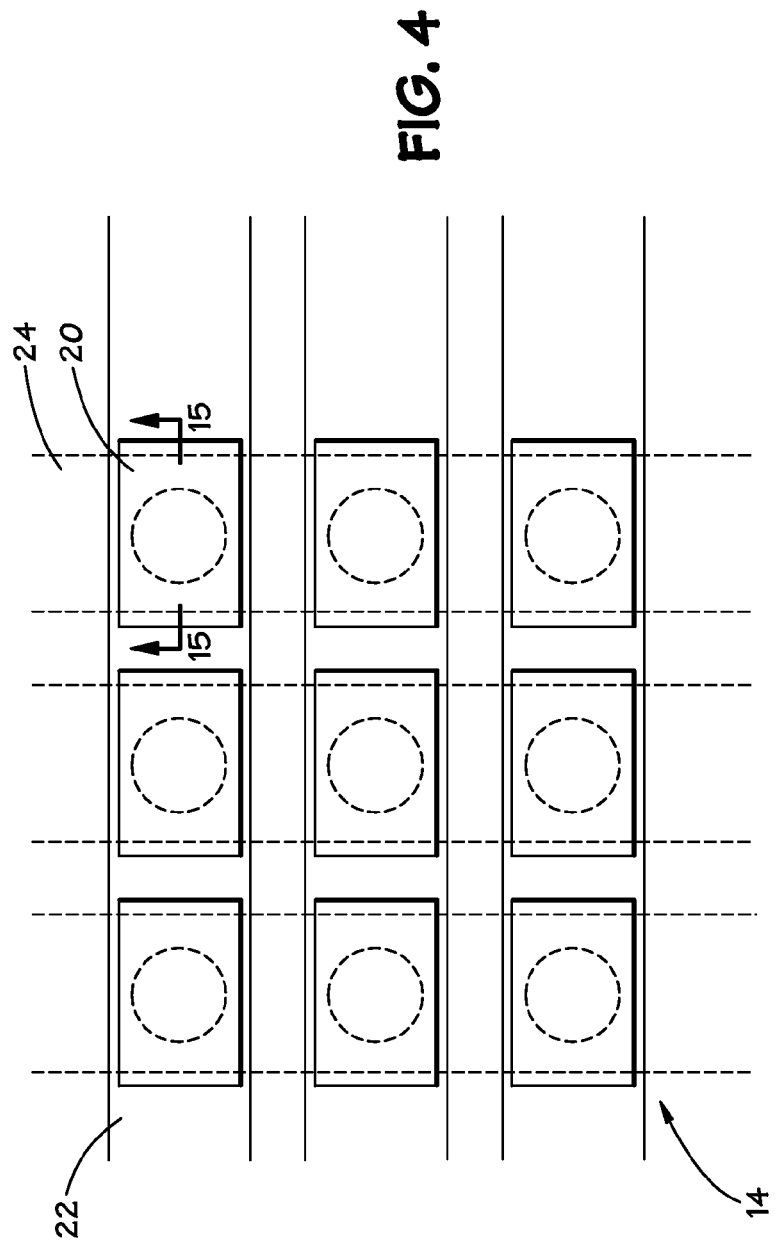

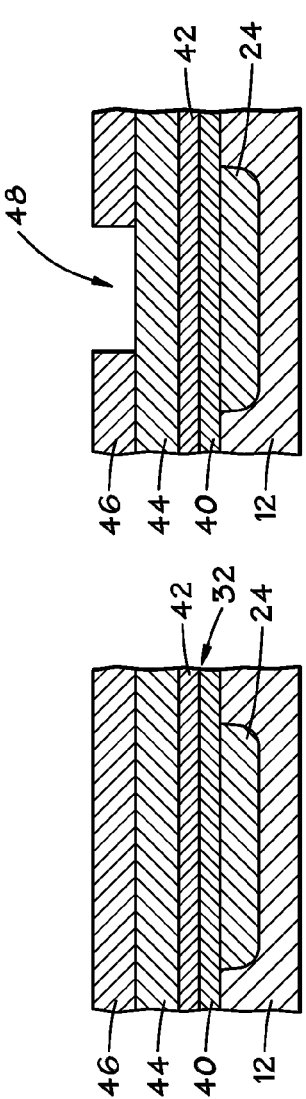
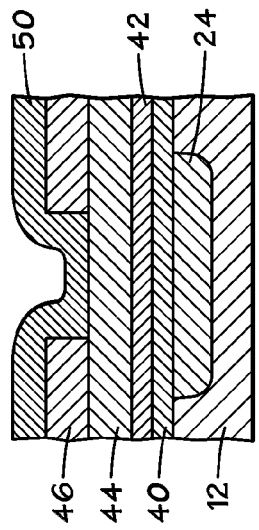
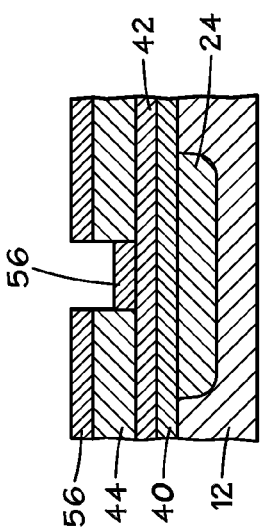
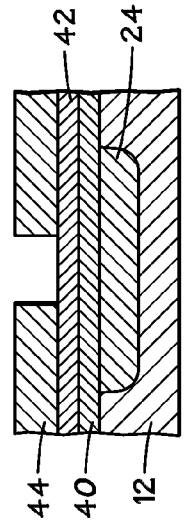
FIG. 5  FIG. 6  FIG. 7
FIG. 8  FIG. 9  FIG. 10

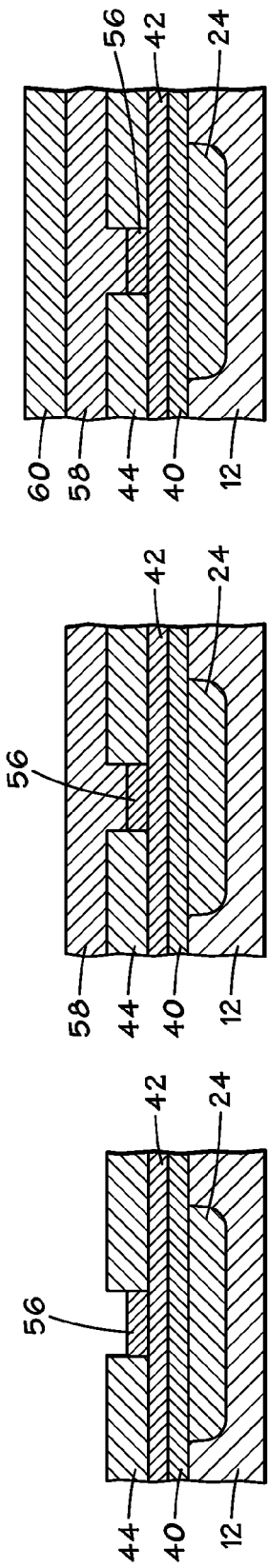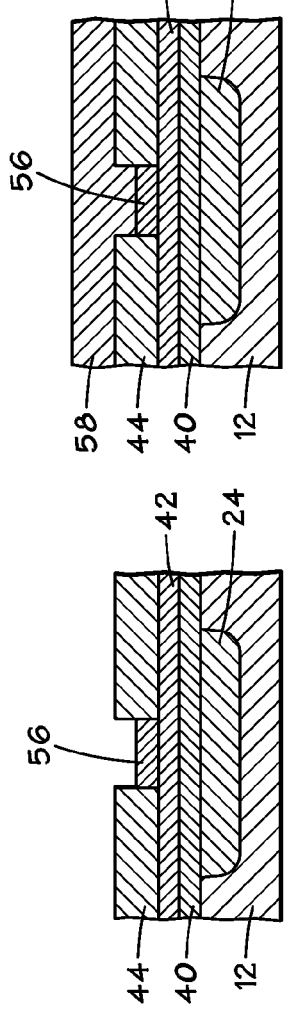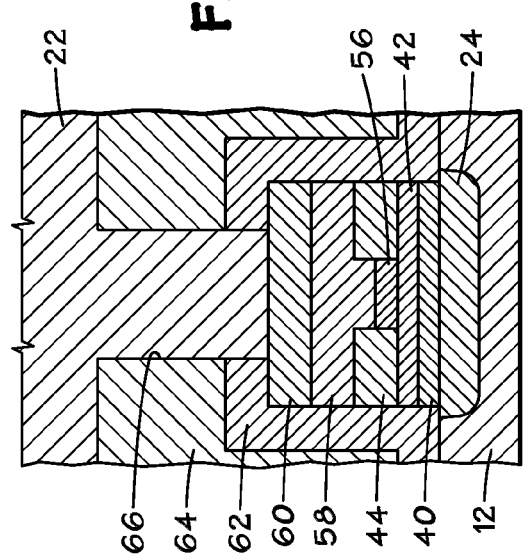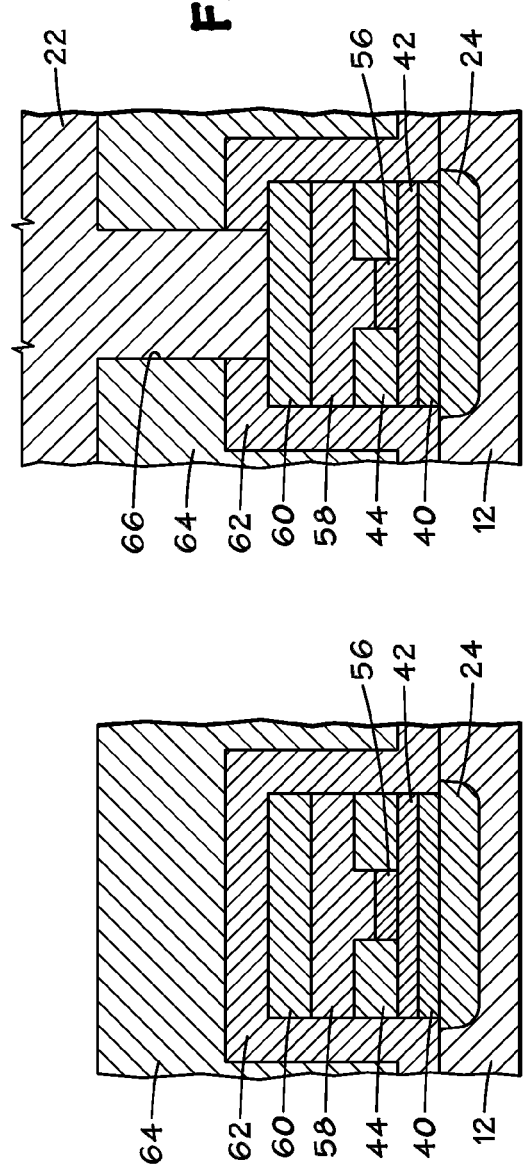

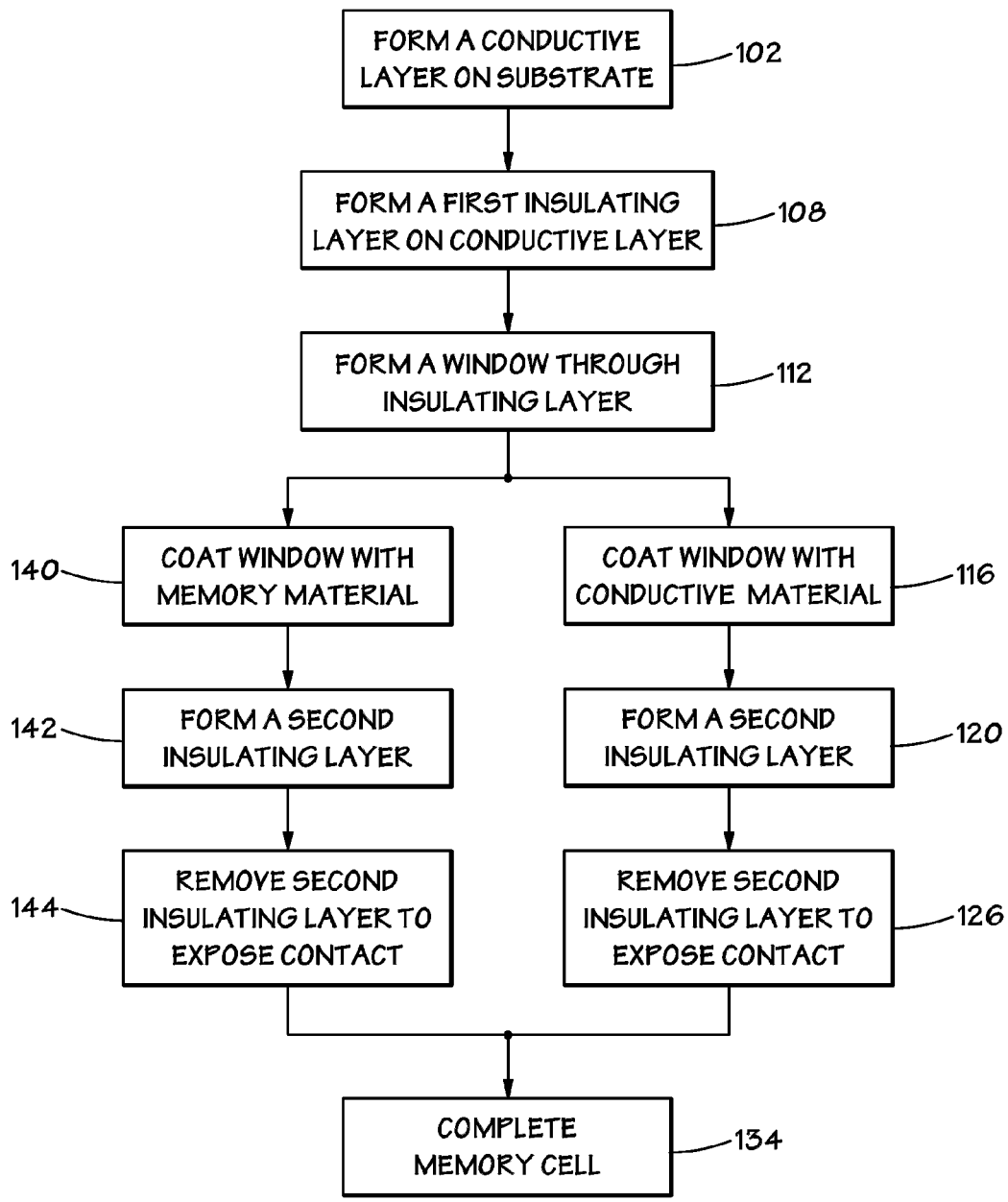

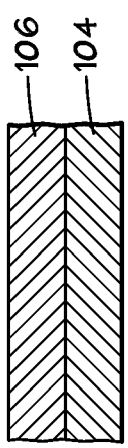
FIG. 17
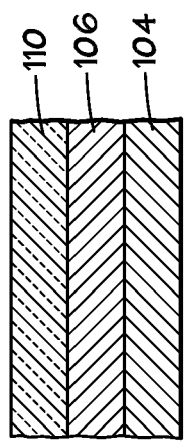
FIG. 18
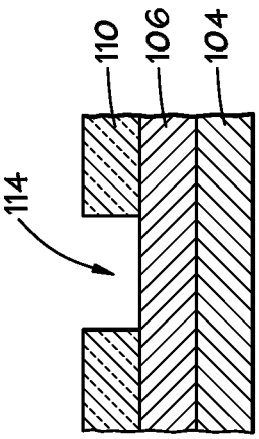
FIG. 19
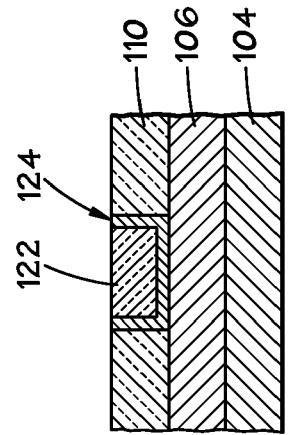
FIG. 20
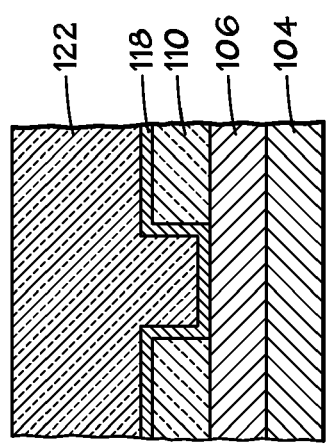
FIG. 21
FIG. 22

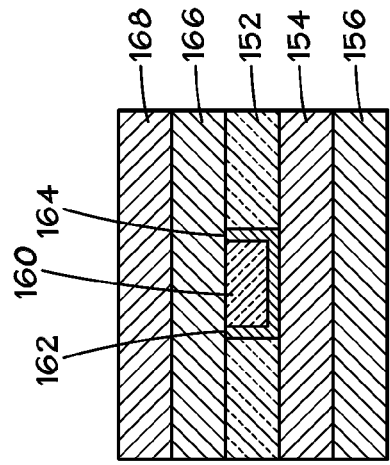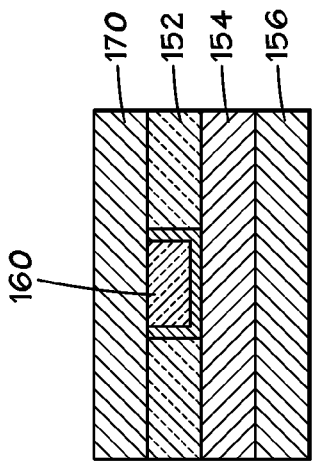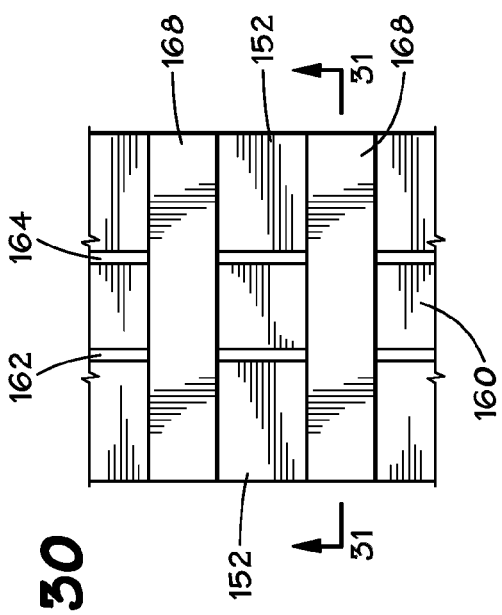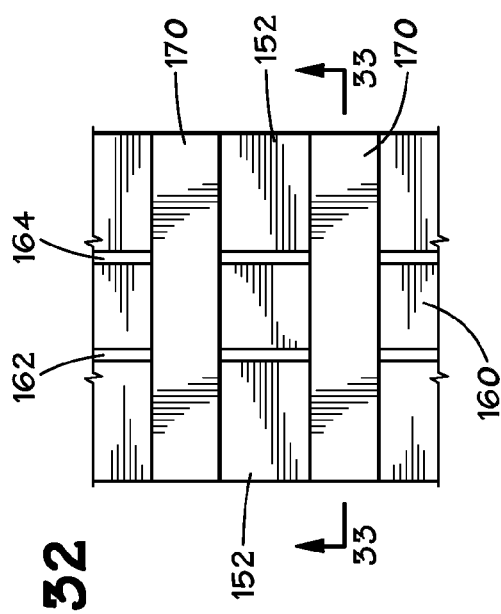

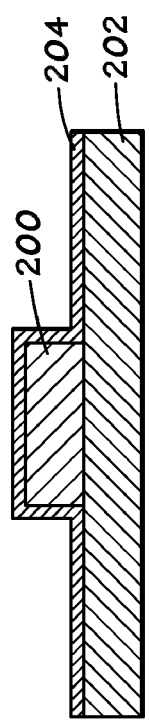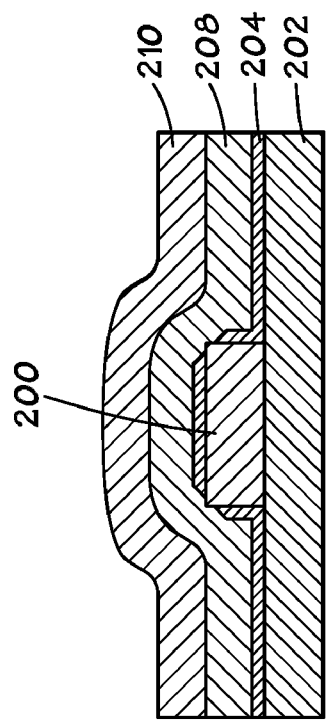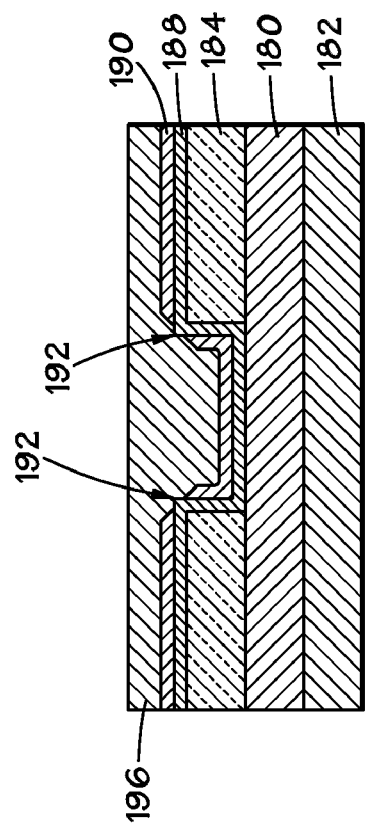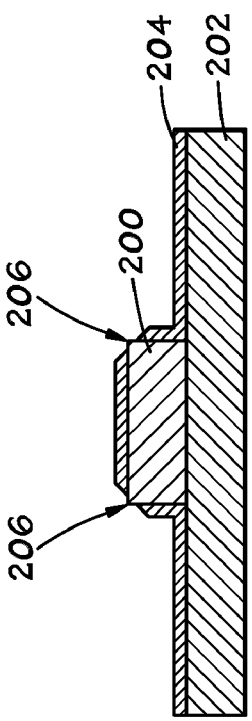
FIG. 38
FIG. 39
FIG. 40
FIG. 41

CONTACT STRUCTURE IN A MEMORY DEVICE

CROSS-REFERENCE TO RELATED APPLICATIONS

This application is a continuation of U.S. application Ser. No. 12/392,886, which was filed on Feb. 25, 2009, and issued as U.S. Pat. No. 8,076,783 on Dec. 13, 2011, which is a continuation of U.S. application Ser. No. 10/334,999, which was filed on Dec. 31, 2002, and issued as U.S. Pat. No. 7,504,730 on Mar. 17, 2009, which is a continuation of U.S. application Ser. No. 09/809,561, which was filed on Mar. 15, 2001, and issued as U.S. Pat. No. 6,563,156 on May 13, 2003, which was allowed for reissue as U.S. application Ser. No. 11/008,755, which was filed on Dec. 9, 2004 and issued as U.S. Pat. No. RE40,842 on Jul. 14, 2009, U.S. application Ser. No. 09/809,561, now U.S. Pat. No. 6,563,156 is a continuation-in-part of U.S. application Ser. No. 09/617,297, which was filed on Jul. 14, 2000 and which issued as U.S. Pat. No. 6,440,837 on Aug. 27, 2002. The disclosures of which is hereby incorporated herein by reference.

BACKGROUND OF THE INVENTION

The invention relates generally to the field of semiconductor devices and fabrication and, more particularly, to memory elements and methods for making memory elements.

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled integrated circuits are used in a wide variety of applications. Such applications include personal computers, vehicle control systems, telephone networks, and a host of consumer products. As is well known, microprocessors are essentially generic devices that perform specific functions under the control of a software program. This program is stored in a memory device coupled to the microprocessor. Not only does the microprocessor access a memory device to retrieve the program instructions, it also stores and retrieves data created during execution of the program in one or more memory devices.

There are a variety of different memory devices available for use in microprocessor-based systems. The type of memory device chosen for a specific function within a microprocessor-based system depends largely upon what features of the memory are best suited to perform the particular function. For instance, volatile memories, such as dynamic random access memories (DRAMs), must be continually powered in order to retain their contents, but they tend to provide greater storage capability and programming options and cycles than non-volatile memories, such as read only memories (ROMs). While non-volatile memories that permit limited reprogramming exist, such as electrically erasable and programmable "ROMs," all true random access memories, i.e., those memories capable of $10^{14}$ programming cycles are more, are volatile memories. Although one time programmable read only memories and moderately reprogrammable memories serve many useful applications, a true nonvolatile random access memory (NVRAM) would likely be needed to surpass volatile memories in usefulness.

Efforts have been underway to create a commercially viable memory device that is both random access and non-volatile using structure changing memory elements, as opposed to the charge storage memory elements used in most commercial memory devices. The use of electrically writable and erasable phase change materials, i.e., materials which can be electrically switched between generally amorphous and generally crystalline states or between different resistive states while in crystalline form, in memory applications is known in the art and is disclosed, for example, in U.S. Pat. No. 5,296,716 to Ovshinsky et al., the disclosure of which is incorporated herein by reference. The Ovshinsky patent is believed to indicate the general state of the art and to contain a discussion of the general theory of operation of chalcogenide materials, which are a particular type of structure changing material.

As disclosed in the Ovshinsky patent, such phase change materials can be electrically switched between a first structural state, in which the material is generally amorphous, and a second structural state, in which the material has a generally crystalline local order. The material may also be electrically switched between different detectable states of local order across the entire spectrum between the completely amorphous and the completely crystalline states. In other words, the switching of such materials is not required to take place in a binary fashion between completely amorphous and completely crystalline states. Rather, the material may be switched in incremental steps reflecting changes of local order to provide a "gray scale" represented by a multiplicity of conditions of local order spanning the spectrum from the completely amorphous state to the completely crystalline state.

These memory elements are monolithic, homogeneous, and formed of chalcogenide material typically selected from the group of Te, Se, Sb, Ni, and Ge. This chalcogenide material exhibits different electrical characteristics depending upon its state. For instance, in its amorphous state the material exhibits a higher resistivity than it does in its crystalline state. Such chalcogenide materials may be switched between numerous electrically detectable conditions of varying resistivity in nanosecond time periods with the input of picojoules of energy. The resulting memory element is truly non-volatile. It will maintain the integrity of the information stored by the memory cell without the need for periodic refresh signals, and the data integrity of the information stored by these memory cells is not lost when power is removed from the device. The memory material is also directly overwritable so that the memory cells need not be erased, i.e., set to a specified starting point, in order to change information stored within the memory cells. Finally, the large dynamic range offered by the memory material theoretically provides for the gray scale storage of multiple bits of binary information in a single cell by mimicking the binary encoded information in analog form and, thereby, storing multiple bits of binary encoded information as a single resistance value in a single cell.

The operation of chalcogenide memory cells requires that a region of the chalcogenide memory material, called the "active region," be subjected to a current pulse to change the crystalline state of the chalcogenide material within the active region. Typically, a current density of between about $10^5$ and $10^7$ amperes/cm$^2$ is needed. To obtain this current density in a commercially viable device having at least one million memory cells, for instance, one theory suggests that the active region of each memory cell should be made as small as possible to minimize the total current drawn by the memory device.

However, known fabrication techniques have not proven sufficient. Currently, chalcogenide memory cells are fabricated by first creating a diode in a semiconductor substrate. A lower electrode is created over the diode, and a layer of dielectric material is deposited onto the lower electrode. A small opening is created in the dielectric layer. A second dielectric layer, typically of silicon nitride, is then deposited onto the dielectric layer and into the opening. The second dielectric layer is typically about 40 Angstroms thick. The chalcogenide material is then deposited over the second dielectric material and into the opening. An upper electrode material is then deposited over the chalcogenide material.

A conductive path is then provided from the chalcogenide material to the lower electrode material by forming a pore in the second dielectric layer by a process known as "popping." Popping involves passing an initial high current pulse through the structure to cause the second dielectric layer to breakdown. This dielectric breakdown produces a conductive path through the memory cell. Unfortunately, electrically popping the thin silicon nitride layer is not desirable for a high density memory product due to the high current and the large amount of testing time required. Furthermore, this technique may produce memory cells with differing operational characteristics, because the amount of dielectric breakdown may vary from cell to cell.

The active regions of the chalcogenide memory material within the pores of the dielectric material created by the popping technique are believed to change crystalline structure in response to applied voltage pulses of a wide range of magnitudes and pulse durations. These changes in crystalline structure alter the bulk resistance of the chalcogenide active region. Factors such as pore dimensions (e.g., diameter, thickness, and volume), chalcogenide composition, signal pulse duration, and signal pulse waveform shape may affect the magnitude of the dynamic range of resistances, the absolute endpoint resistances of the dynamic range, and the voltages required to set the memory cells at these resistances. For example, relatively thick chalcogenide films, e.g., about 4000 Angstroms, result in higher programming voltage requirements, e.g., about 15-25 volts, while relatively thin chalcogenide layers, e.g., about 500 Angstroms, result in lower programming voltage requirements, e.g., about 1-7 volts. Thus, to reduce the required programming voltage, one theory suggests reducing the volume of the active region. Another theory suggests that the cross-sectional area of the pore should be reduced to reduce the size of the chalcogenide element. In a thin chalcogenide film, where the pore width is on the same order as the thickness of the chalcogenide film, the current has little room to spread, and, thus, keeps the active region small.

The present invention is directed to overcoming, or at least reducing the affects of, one or more of the problems set forth above.

BRIEF DESCRIPTION OF THE DRAWINGS

The foregoing and other advantages of the invention may become apparent upon reading the following detailed description and upon reference to the drawings in which:

FIG. 3 illustrates an exemplary memory cell having a memory element, such as a resistor, and an access device, such as a diode;

FIG. 4 illustrates a top view of a portion of a semiconductor memory array;

FIG. 5 illustrates a cross-sectional view of an exemplary memory cell at an early stage of fabrication;

FIG. 6, FIG. 7, and FIG. 8 illustrate the formation of a spacer and a small pore for the exemplary memory element;

FIG. 9 illustrates the small pore of the memory element;

FIG. 10 and FIG. 11 illustrate the formation of an electrode in the small pore;

FIG. 12 illustrates the deposition of memory material over the lower electrode;

FIG. 13 illustrates the deposition of the upper electrode of the memory cell;

FIG. 14 illustrates the deposition of an insulative layer and an oxide layer over the upper electrode of the memory cell;

FIG. 15 illustrates the formation of a contact extending through the oxide and insulative layer to contact the upper electrode;

FIG. 16 illustrates a flow chart depicting an illustrative method of fabricating an annular contact;

FIG. 17 illustrates a conductive layer over a substrate;

FIG. 18 illustrates a dielectric layer on the structure of FIG. 17;

FIG. 19 illustrates a window or trench in the dielectric layer of FIG. 18;

FIG. 20 illustrates a conductive or chalcogenide layer on the structure of FIG. 19;

FIG. 21 illustrates a dielectric layer on the structure of FIG. 20;

FIG. 22 illustrates the formation of a contact by removal of the dielectric layer from the surface of the structure of FIG. 21;

FIGS. 26 through 33 illustrate the formation of linear electrodes using processes similar to those used in reference to FIGS. 16 through 25;

FIGS. 34 through 38 illustrate the formation of electrodes using facet etch processes;

FIGS. 39 through 41 illustrate the formation of a first electrode embodiment using facet etch processes.

DETAILED DESCRIPTION

Specific embodiments of memory elements and methods of making such memory elements are described below as they might be implemented for use in semiconductor memory circuits. In the interest of clarity, not all features of an actual implementation are described in this specification. It should be appreciated that in the development of any such actual implementation (as in any semiconductor engineering project), numerous implementation-specific decisions must be made to achieve the developers' specific goals, such as compliance with system-related and business-related constraints, which may vary from one implementation to another. Moreover, it should be appreciated that such a development effort might be complex and time-consuming, but would nevertheless be a routine undertaking of semiconductor design and fabrication for those of ordinary skill having the benefit of this disclosure.

Figure 1:
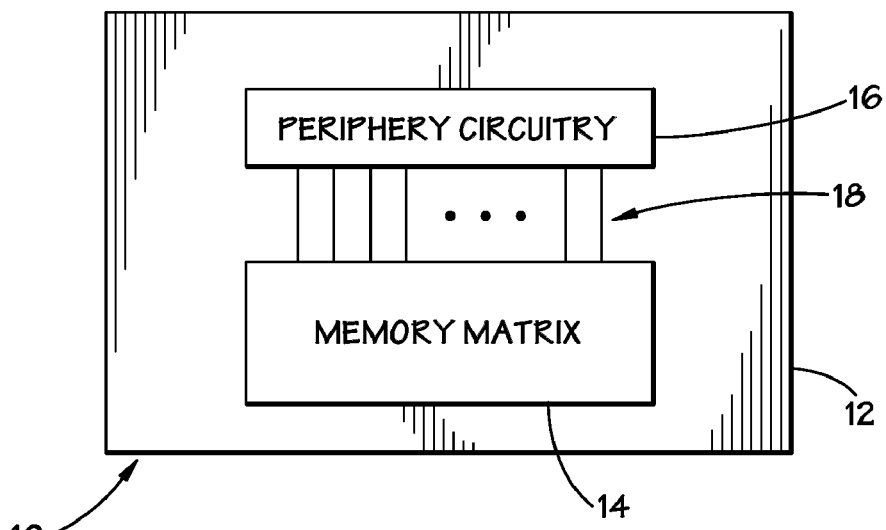
FIG. 1 illustrates a schematic depiction of a substrate containing a memory device which includes a memory matrix and peripheral circuitry.

Turning now to the drawings, and referring initially to FIG. 1, a memory device is illustrated and generally designated by a reference numeral 10. The memory device 10 is an integrated circuit memory that is advantageously formed on a semiconductor substrate 12. The memory device 10 includes a memory matrix or array 14 that includes a plurality of memory cells for storing data, as described below. The memory matrix 14 is coupled to periphery circuitry 16 by the plurality of control lines 18. The periphery circuitry 16 may include circuitry for addressing the memory cells contained within the memory matrix 14, along with circuitry for storing data in and retrieving data from the memory cells. The periphery circuitry 16 may also include other circuitry used for controlling or otherwise insuring the proper functioning of the memory device 10.

Figure 2:
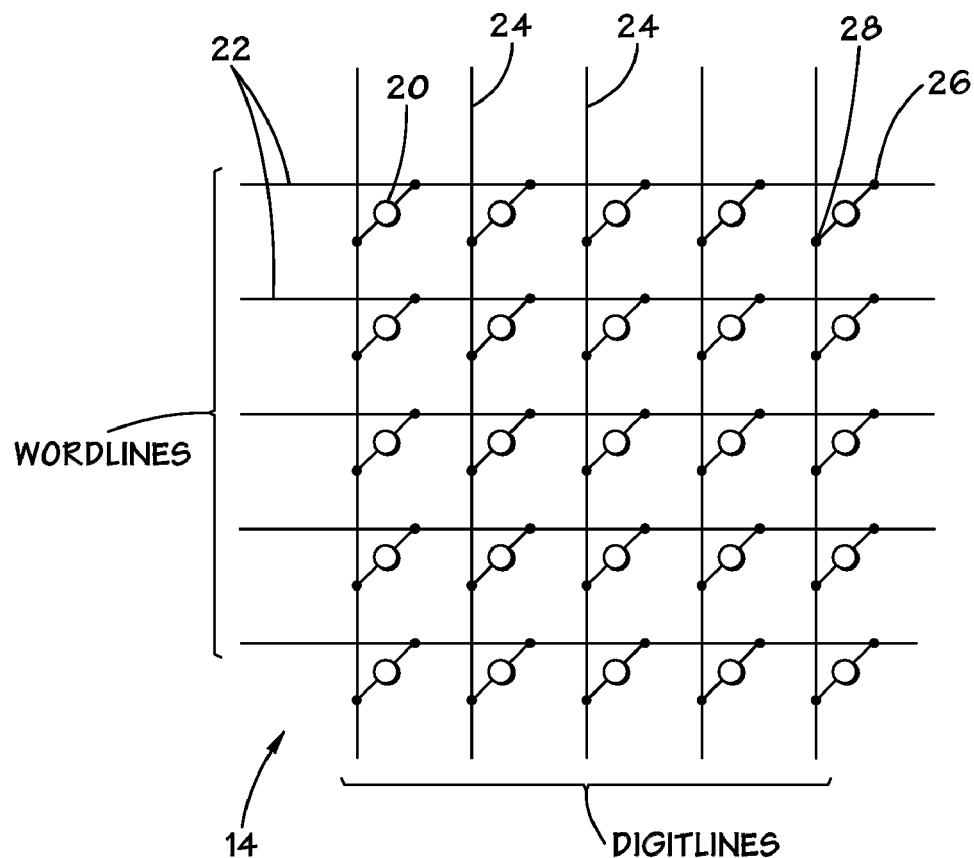
FIG. 2 illustrates an exemplary schematic depiction of the memory matrix or array of FIG. 1.

A more detailed depiction of the memory matrix 14 is illustrated in FIG. 2. As can be seen, the memory matrix 14 includes a plurality of memory cells 20 that are arranged in generally perpendicular rows and columns. The memory cells 20 in each row are coupled together by a respective word line 22, and the memory cells 20 in each column are coupled together by a respective digit line 24. Specifically, each memory cell 20 includes a word line node 26 that is coupled to a respective word line 22, and each memory cell 20 includes a digit line node 28 that is coupled to a respective digit line 24. The conductive word lines 22 and digit lines 24 are collectively referred to as address lines. These address lines are electrically coupled to the periphery circuitry 16 so that each of the memory cells 20 can be accessed for the storage and retrieval of information.

FIG. 3 illustrates an exemplary memory cell 20 that may be used in the memory matrix 14. The memory cell 20 includes a memory element 30 which is coupled to an access device 32. In this embodiment, the memory element 30 is illustrated as a programmable resistive element, and the access device 32 is illustrated as a diode. Advantageously, the programmable resistive element may be made of a chalcogenide material, as will be more fully explained below. Also, the diode 32 may be a conventional diode, a zener diode, or an avalanche diode, depending upon whether the diode array of the memory matrix 14 is operated in a forward biased mode or a reverse biased mode. As illustrated in FIG. 3, the memory element 30 is coupled to a word line 22, and the access device is coupled to a digit line 24. However, it should be understood that connections of the memory element 20 may be reversed without adversely affecting the operation of the memory matrix 14.

As mentioned previously, a chalcogenide resistor may be used as the memory element 30. A chalcogenide resistor is a structure changing memory element because its molecular order may be changed between an amorphous state and a crystalline state by the application of electrical current. In other words, a chalcogenide resistor is made of a state changeable material that can be switched from one detectable state to another detectable state or states. In state changeable materials, the detectable states may differ in their morphology, surface typography, relative degree of order, relative degree of disorder, electrical properties, optical properties, or combinations of one or more of these properties. The state of a state changeable material may be detected by measuring the electrical conductivity, electrical resistivity, optical transmissivity, optical absorption, optical refraction, optical reflectivity, or a combination of these properties. In the case of a chalcogenide resistor specifically, it may be switched between different structural states of local order across the entire spectrum between the completely amorphous state and the completely crystalline state.

As mentioned previously, a chalcogenide resistor may be used as the memory element 30. A chalcogenide resistor is a structure changing memory element because its molecular order may be changed between an amorphous state and a crystalline state by the application of electrical current. In other words, a chalcogenide resistor is made of a state changeable material that can be switched from one detectable state to another detectable state or states. In state changeable materials, the detectable states may differ in their morphology, surface typography, relative degree of order, relative degree of disorder, electrical properties, optical properties, or combinations of one or more of these properties. The state of a state changeable material may be detected by measuring the electrical conductivity, electrical resistivity, optical transmissivity, optical absorption, optical refraction, optical reflectivity, or a combination of these properties. In the case of a chalcogenide resistor specifically, it may be switched between different structural states of local order across the entire spectrum between the completely amorphous state and the completely crystalline state.

The previously mentioned Ovshinsky patent contains a graphical representation of the resistance of an exemplary chalcogenide resistor as a function of voltage applied across the resistor. It is not unusual for a chalcogenide resistor to demonstrate a wide dynamic range of attainable resistance values of about two orders of magnitude. When the chalcogenide resistor is in its amorphous state, its resistance is relatively high. As the chalcogenide resistor changes to its crystalline state, its resistance decreases.

As discussed in the Ovshinsky patent, low voltages do not alter the structure of a chalcogenide resistor, while higher voltages may alter its structure. Thus, to "program" a chalcogenide resistor, i.e., to place the chalcogenide resistor in a selected physical or resistive state, a selected voltage in the range of higher voltages is applied across the chalcogenide resistor, i.e., between the word line 22 and the digit line 24. Once the state of the chalcogenide resistor has been set by the appropriate programming voltage, the state does not change until another programming voltage is applied to the chalcogenide resistor. Therefore, once the chalcogenide resistor has been programmed, a low voltage may be applied to the chalcogenide resistor, i.e., between the word line 22 and the digit line 24, to determine its resistance without changing its physical state. As mentioned previously, the addressing, programming, and reading of the memory elements 20 and, thus, the application of particular voltages across the word lines 22 and digit lines 24, is facilitated by the periphery circuitry 16.

The memory cell 20, as illustrated in FIG. 3, may offer significant packaging advantages as compared with memory cells used in traditional random access and read only memories. This advantage stems from the fact that the memory cell 20 is a vertically integrated device. In other words, the memory element 30 may be fabricated on top of the access device 32. Therefore, using the memory cell 20, it may be possible to fabricate a cross-point cell that is the same size as the crossing area of the word line 22 and the digit line 24, as illustrated in FIG. 4. However, the size of the access device 32 typically limits the area of the memory cell 20, because the access device 32 must be large enough to handle the programming current needed by the memory element 30.

As discussed previously, to reduce the required programming current, many efforts have been made to reduce the pore size of the chalcogenide material that forms the memory element 30. These efforts have been made in view of the theory that only a small portion of the chalcogenide material, referred to as the "active region," is structurally altered by the programming current. However, it is believed that the size of the active region of the chalcogenide memory element 30 may be reduced by reducing the size of an electrode which borders the chalcogenide material. By reducing the active region and, thus, the required programming current, the size of the access device may be reduced to create a cross-point cell memory.

To make a commercially viable semiconductor memory array having a plurality of such memory cells, such memory cells should be reproducible so that all memory cells act substantially the same. As alluded to earlier, by controlling the active region of the chalcogenide material of each memory cell, a memory array of relatively uniform memory cells may be created. To control the active region, the contact area between the chalcogenide and one or both of its electrodes may be controlled, and/or the volume of the chalcogenide material may be controlled. However, as described next, one technique for creating a substantially circular memory element using chalcogenide material, which produces good results, may nonetheless be improved upon to create memory cells having more uniformity. Before discussing these improvements, however, it is important to understand the technique for creating a substantially circular memory element.

This technique for creating a circular non-volatile memory element generally begins with a small photolithographically defined feature. This feature, a circular hole, is reduced in circumference by adding a non-conductive material, such as a dielectric, to its sidewalls. The resulting smaller hole serves as a pattern for a pore that holds an electrode and/or the structure changing memory material. In either case, the final contact area between the structure changing memory material and the electrode is approximately equal to the circular area of the smaller hole.

The actual structure of an exemplary memory cell 20 is illustrated in FIG. 15, while a method for fabricating the memory cell 20 is described with reference to FIGS. 5-15. It should be understood that while the fabrication of only a single memory cell 20 is discussed below, thousands of similar memory cells may be fabricated simultaneously. Although not illustrated, each memory cell is electrically isolated from other memory cells in the array in any suitable manner, such as by the addition imbedded field oxide regions between each memory cell.

In the interest of clarity, the reference numerals designating the more general structures described in reference to FIGS. 1-4 will be used to describe the more detailed structures illustrated in FIGS. 5-15, where appropriate. Referring first to FIG. 5, the digit lines 24 are formed in or on a substrate 12. As illustrated in FIG. 5, the digit line 24 is formed in the P-type substrate 12 as a heavily doped N+ type trench. This trench may be strapped with appropriate materials to enhance its conductivity. The access device 32 is formed on top of the digit line 24. The illustrated access device 32 is a diode formed by a layer of N doped polysilicon 40 and a layer of P+ doped polysilicon 42. Next, a layer of insulative or dielectric material 44 is disposed on top of the P+ layer 42. The layer 44 may be formed from any suitable insulative or dielectric material, such as silicon nitride.

The formation of a small pore in the dielectric layer 44 is illustrated with reference to FIGS. 5-9. First, a hard mask 46 is deposited on top of the dielectric layer 44 and patterned to form a window 48, as illustrated in FIG. 6. The window 48 in the hard mask 46 is advantageously as small as possible. For instance, the window 48 may be formed at the photolithographic limit by conventional photolithographic techniques. The photolithographic limit, i.e., the smallest feature that can be patterned using photolithographic techniques, is currently about 0.18 micrometers. Once the window 48 has been formed in the hard mask 46, a layer of spacer material 50, such as silicon dioxide, is deposited over the hard mask 46 in a conformal fashion so that the upper surface of the spacer material 50 is recessed where the spacer material 50 covers the window 48.

The layer of spacer material 50 is subjected to an anisotropic etch using a suitable etchant, such as $CHF_3$. The rate and time of the etch are controlled so that the layer of spacer material 50 is substantially removed from the upper surface of the hard mask 48 and from a portion of the upper surface of the dielectric layer 44 within the window 48, leaving sidewall spacers 52 within the window 48. The sidewall spacers 52 remain after a properly controlled etch because the vertical dimension of the spacer material 50 near the sidewalls of the window 48 is approximately twice as great as the vertical dimension of the spacer material 50 on the surface of the hard mask 46 and in the recessed area of the window 48.

Once the spacers 52 have been formed, an etchant is applied to the structure to form a pore 54 in the dielectric layer 44, as illustrated in FIG. 8. The etchant is an anisotropic etchant that selectively removes the material of the dielectric layer 44 bounded by the spacers 52 until the P+ layer 42 is reached. As a result of the fabrication method to this point, if the window 48 is at the photolithographic limit, the pore 54 is smaller than the photolithographic limit, e.g., on the order of 0.06 micrometers. After the pore 54 has been formed, the hard mask 46 and the spacers 52 may be removed, as illustrated in FIG. 9. The hard mask 46 and the spacers 52 may be removed by any suitable method, such as by etching or by chemical mechanical planarization (CMP).

The pore 54 is then filled to a desired level with a material suitable to form the lower electrode of the chalcogenide memory element 30. As illustrated in FIG. 10, a layer of electrode material 56 is deposited using collimated physical vapor deposition (PVD). By using collimated PVD, or another suitable directional deposition technique, the layer of electrode material 56 is formed on top of the dielectric layer 44 and within the pore 54 with substantially no sidewalls. Thus, the layer of electrode material 56 on top of the dielectric layer 44 may be removed, using CMP for instance, to leave the electrode 56 at the bottom of the pore 54, as illustrated in FIG. 11. It should be understood that the electrode material 56 may be comprised of one or more materials, and it may be formed in one or more layers. For instance, a lower layer of carbon may be used as a barrier layer to prevent unwanted migration between the subsequently deposited chalcogenide material and the P+ type layer 42. A layer of titanium nitride (TiN) may then be deposited upon the layer of carbon to complete the formation of the electrode 56.

After the lower electrode 56 has been formed, a layer of chalcogenide material 58 may be deposited so that it contacts the lower electrode 56, as illustrated in FIG. 12. If the lower electrode 56 is recessed within the pore 54, a portion of the chalcogenide material 58 will fill the remaining portion of the pore 54. In this case, any chalcogenide material 58 adjacent the pore 54 on the surface of the dielectric layer 44 may be removed, using CMP for instance, to create a chalcogenide element of extremely small proportions. Alternatively, if the lower electrode 56 completely fills the pore 54, the chalcogenide material 58 adjacent the pore 54 may remain, because the extremely small size of the lower electrode 56 still creates a relatively small active area in a vertical direction through the chalcogenide material 58. Because of this characteristic, even if the lower electrode 56 only partially fills the pore 54, as illustrated, the excess chalcogenide material 58 adjacent the pore 54 need not be removed to create a memory element 30 having an extremely small active area.

Regardless of which alternative is chosen, the upper electrode 60 is deposited on top of the chalcogenide material 58, as illustrated in FIG. 13. After the upper electrode 60, the chalcogenide material 58, the dielectric layer 44, and the access device 32 have been patterned and etched to form an individual memory cell 20, a layer of insulative material 62 is deposited over the structure, as illustrated in FIG. 14. A layer of oxide 64 is then deposited over the insulative layer 62. Finally, the oxide layer 64 is patterned and a contact hole 66 is formed through the oxide layer 64 and the insulative layer 62, as illustrated in FIG. 15. The contact hole 66 is filled with a conductive material to form the word line 22.

Although this technique, as previously mentioned, produces good results, there can be substantial variation in size of the many circular pores 54 formed to create the memory cell array. Lithographic variations during the formation of a structure such as the one described above are typically in the range of ±10% of the lithographic feature, i.e., ±10% of the diameter of the window 48. A variation in circular area ($\Delta A_f$) with respect to the intended circular area ($A_f$) is approximately equal to:

$$\frac{\Delta A_f}{A_f} \approx \frac{\Delta R_i}{R_i}\left(\frac{2R_i}{R_f}\right) \qquad \text{Equation 1}$$

where $R_i$ represents the initial radius of the window 48, and $R_f$ represents the final radius of the pore 54, and $\Delta R_i$ represents the variation in the radius $R_i$ due to, for example, photolithography and pattern transfer. Photolithographic deviations in pore formation can cause a variation in actual contact area versus intended contact area that is approximately equal to the variation in actual radius of the window 48 versus the desired radius of the window 48 multiplied by twice the ratio of the variation in the actual radius versus desired radius. Similarly, deposition thickness deviations during formation of the spacers 52 are typically in the range of ±10% of the deposited layer's thickness. A variation in circular contact area ($\Delta A_f$) with respect to the intended circular contact area ($A_f$) is approximately equal to:

$$\frac{\Delta A_f}{A_f} \approx \frac{\Delta h_s}{h_s}\left(2 - \frac{2R_i}{R_f}\right) \qquad \text{Equation 2}$$

where $h_s$ represents the thickness of the spacer 52, $\Delta h_s$ represents the variation in the thickness of the spacer 52, and $R_i$ and $R_f$ are defined above. Deposition deviations in spacer thickness can cause a variation in actual circular contact area versus intended contact area that is approximately equal to the variation in spacer thickness versus the desired spacer thickness multiplied by a number greater than zero which is dependent upon the initial and final contact hole radius.

Because of photolithographic and deposition variations during processing, such as those discussed above, the reproducibility of small circular contacts between different elements in a semiconductor circuit can suffer. To enhance the uniformity and reproducibility of contacts between different elements in a semiconductor circuit, an annular contact structure, which exhibits a greatly reduced susceptibility to process variations, may be implemented. However, before discussing an exemplary implementation, the reduced susceptibility to process variations will first be explained using many of the terms defined above for clarity and comparison.

Area variation ($\Delta A_f$) for an annular contact which is thin with respect to the intended contact area ($A_f$) is approximately equal to the ratio of the variation in the initial contact hole's radius versus the desired initial contact hole radius, $$\frac{\Delta A_f}{A_f} \approx \frac{\Delta R_i}{R_i} \qquad \text{Equation 3}$$

where $R_i$ represents the circular window's initial radius before an annular contact is formed, and $\Delta R_i$ represents the variation in the annular contact's radius as a result of forming the annulus.

Similarly, deviations in deposition thickness of an annular contact structure cause a variation in contact area ($\Delta A_f$) versus intended area ($A_f$) that is approximately equal to the variation in annulus thickness versus the desired annulus thickness, $$\frac{\Delta A_f}{A_f} \approx \frac{\Delta h_A}{h_A} \qquad \text{Equation 4}$$

where $h_A$ represents annulus thickness, and $\Delta h_A$ represents the variation in annulus thickness.

Comparison of Equation 3 with Equation 1 demonstrates that a thin annular contact structure exhibits less deviation due to lithographic variations than does a circular contact structure having an equal area:

$$\frac{\Delta A_A}{A_f} \approx \frac{\Delta R_i}{R_i} \text{ and } \frac{\Delta A_C}{A_f} \approx \frac{\Delta R_i}{R_i}\left(\frac{2R_i}{R_f}\right).$$

Since $R_i$ is always greater than $R_f$, $$\left|\frac{\Delta R_i}{R_i}\right| < \left|\frac{\Delta R_i}{R_i}\left(\frac{2R_i}{R_f}\right)\right| \qquad \text{Equation 5}$$

Thus, $$\left|\frac{\Delta A_A}{A_f}\right| < \left|\frac{\Delta A_C}{A_f}\right| \qquad \text{Equation 6}$$

Here, $A_f$ represents the final or desired contact area, $\Delta A_A$ represents the variation in the annular contact area, $\Delta A_c$ represents the variation in the circular contact area, $R_i$ represents the contact hole's initial radius, $R_f$ represents the contact hole's final radius, $\Delta R_i$ represents the variation in the contact hole's radius due to, for example, lithographic and pattern transfer operations, and $\|$ represents an absolute value operation.

Likewise, a comparison of Equation 4 and Equation 2 demonstrates that a thin annular contact structure, which would correspond in area to a circular contact with final radius less than approximately two-thirds the initial radius, exhibits less deviation due to deposition variations than does the corresponding circular contact structure:

$$\frac{\Delta A_A}{A_f} \approx \frac{\Delta h_A}{h_A} \text{ and } \frac{\Delta A_C}{A_f} \approx \frac{\Delta h_s}{h_s}\left(2 - \frac{2R_i}{R_f}\right) \qquad \text{Equation 7}$$

-continued

Where $R_f < \frac{2}{3} R_i$ $$\left| \frac{\Delta h_A}{h_A} \right| < \left| \frac{\Delta h_s}{h_s} \left( 2 - \frac{2R_i}{R_f} \right) \right|$$

From fabrication experience it is observed that $$\frac{\Delta h_A}{h_A} \approx \frac{\Delta h_s}{h_s}$$

for a large variety of materials over a large range of thicknesses. Thus, $$\left| \frac{\Delta A_A}{A_f} \right| < \left| \frac{\Delta A_C}{A_f} \right| \qquad \text{Equation 8}$$

where all symbols retain their previous definitions.

Thus, as compared to small sublithographic circular contacts, a contact structure having a thin annular geometry provides a more reproducible feature. That is, starting from the same lithographic feature, i.e., a contact hole or window, and ending with the same contact area, a thin annular contact should have less variation in contact area than a comparable circular contact. Furthermore, due to the relatively wide contact hole of the annular contact, it is easier to produce a conformal annular contact than it is a void-free circular contact. Also, the annular extent may be greater for less susceptibility to being blocked by particles.

Turning again to the drawings, and referring to FIG. 16, a flowchart 100 depicts one method for forming a thin annular contact structure. By further referring to FIGS. 17-25, in conjunction with the method set forth in the flowchart 100, there is illustrated a semiconductor device, in various stages of fabrication, in which a thin annular contact structure is formed.

Referring first to block 102 and FIG. 17, a semiconductor substrate 104 is provided. The substrate 104 may contain various device structures that have not been illustrated for the sake of clarity. For instance, the substrate 104 may include a digit line and an access device, such as the digit line 24 and the access device 32 described above with reference to FIGS. 5-15. A conductive layer 106 is deposited onto the substrate 104. This conductive layer 106 may be deposited in any suitable manner, such as by physical or chemical vapor deposition. The conductive layer 106 may be comprised of one or more layers, and it may include one or more materials. For instance, if the conductive layer 106 is to be used as the bottom electrode for a chalcogenide memory element, the conductive layer 106 may include a layer of titanium nitride deposited on the substrate 104, with a layer of carbon deposited on the layer of titanium nitride to prevent unwanted migration between the subsequently deposited chalcogenide material and the substrate 104.

Referring next to block 108 and FIG. 18, a first insulating layer 110 is formed on top of the conductive layer 106. The insulating layer 110 may be formed in any suitable manner, such as by CVD. The material used for the first insulating layer 110 can be, for example, a relatively thick layer of boron and phosphorous doped silicon dioxide glass (BPSG), which may be advantageous for deep contacts, e.g., contact holes having a depth greater than their diameter. Alternatively, the material used for the first insulating layer 110 could be undoped silicon dioxide or silicon nitride, which may be advantageous for shallow contacts, e.g., contact holes having a depth less than their diameter. As will be discussed below, using silicon nitride as the material for the first insulating layer 110 may provide a further benefit in that it can serve as a CMP stop material.

Referring now to block 112 and FIG. 19, a contact hole or window 114 is formed through the insulating layer 110 to expose a portion of the underlying conductive layer 106. Again, any suitable method of forming the window 114 may be used. For instance, using standard photolithographic techniques, a hard mask (not shown) may be deposited on top of the insulating layer 110 and patterned in the size and shape of the resulting window 114, advantageously at the photolithographic limit. An etchant may then be applied to remove the insulating material under the patterned hard mask to form the window 114. After etching, the hard mask is removed. However, the window 114 may also be fabricated to be smaller than the photolithographic limit by using spacer technology, as described previously with reference to FIGS. 6-9.

As can be seen in block 116 and FIG. 20, a thin film 118 is disposed over the insulating layer 110 and the window 114. The thickness of the film 118 is small compared to the radius of the window 114. The film 118 may be a conductive material, if an annular electrode is to be formed, or the film 118 may be a structure changing memory material, such as chalcogenide, if an annular memory element is to be formed. For the purpose of clarity, the formation of an annular electrode will first be discussed, followed by a discussion of the formation of an annular memory element.

Generally speaking, any conductive material that is conformal to the window 114 and which has good adhesion properties for a subsequently formed insulating layer may be suitable to form the film 118. Exemplary conductive materials may include titanium nitride, carbon, aluminum, titanium, tungsten, tungsten silicide, and copper, along with combinations and alloys of these materials. A benefit of using carbon as the conductive material is that it can serve as a mechanical stop for a subsequent CMP process described below.

Referring next to block 120 and FIG. 21, a second insulating layer 122 is formed over the structure. In general, the thickness of the second insulating layer 122 is one to two times the depth of the contact hole 114 for shallow contact holes. The same materials used to form the first insulating layer 110 may also be used to form the second insulating layer 122.

Figure 23:
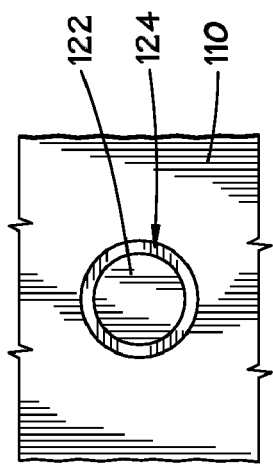
FIG. 23 illustrates a top view of the structure of FIG. 22.
Figure 26:
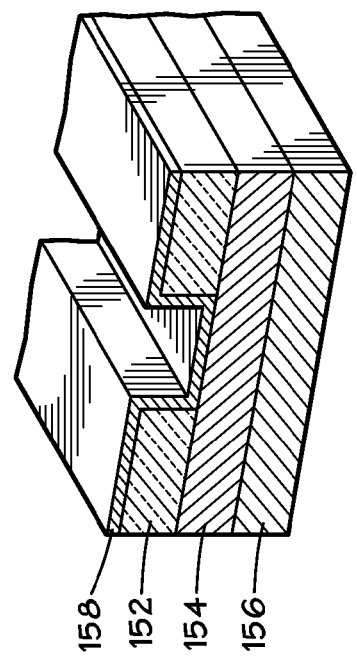

The second insulating layer 122 and the conductive film 118 are removed from the surface of the first insulating layer 110 to form an annular electrode 124, as may be seen from a study of block 126 and FIGS. 22 and 23. One technique for removing the second insulating layer 122 and the conductive film 118 on top of the layer 110 is the CMP process. The CMP process may be performed in one or more steps. For instance, if a CMP stop material, such as carbon, is used as the conductive film 118, or if a layer of carbon is disposed on top of the layer 110, the CMP step may be followed by an etch, such as a plasma-oxygen etch, for example, to remove any horizontally extending carbon that may be left in tact by the CMP operation. Alternatively, the layer 110 may be used as a CMP stop, so the conductive film 118 would not act as a CMP stop. Typical conducting materials that may be used that are not natural CMP stops include titanium nitride and tungsten silicide. Accordingly, in this example, an additional etching step would not be used.

Figure 24:
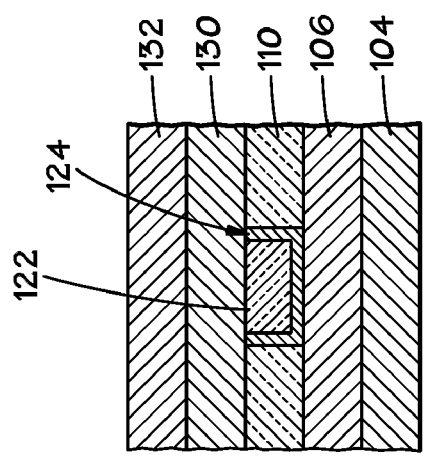
FIG. 24 illustrates a chalcogenide layer and a conductive layer on the structure of FIG. 22.

If the annular electrode 124 is to be used as a bottom electrode of a chalcogenide memory element, the remainder of the memory cell is created, as set forth in block 134. To create a memory cell, a layer of chalcogenide 130 may be deposited over the annular electrode 124, and another conductive layer or line 132 may be deposited over the layer of chalcogenide 130, as illustrated in FIG. 24. In this example, the thickness of the layer of chalcogenide 130 is controlled, but the volume of the layer of chalcogenide 130 is not controlled. In fact, the layer of chalcogenide 130 may be a blanket layer or a linear layer formed over other annular electrodes in the array. However, the contact area between the annular electrode 124 and the layer of chalcogenide 130 is controlled well, which in turn controls the chalcogenide active region. Thus, an array of such memory cells should contain a plurality of reproducible memory elements with uniform active regions. In view of current theory, such memory cells should operate in a uniform manner suitable for a modern high density semiconductor memory.

Now, referring back to FIG. 20 and to block 140 of FIG. 16, the formation of an annular memory element will be discussed using the same reference numerals occasionally to refer to different materials than those discussed above for purposes of clarity. For instance, instead of the film 118 being composed of a conductive material, as discussed above, the film 118 may be composed of a structure changing memory material. Such memory material may be chalcogenide or any other suitable memory material. Such memory material should also be suitable for conformal deposition in the window 114 and demonstrate good adhesion properties for a subsequently formed insulating layer.

Various types of chalcogenide materials may be used to form the film 118. For example, chalcogenide alloys may be formed from tellurium, antimony, germanium, selenium, bismuth, lead, strontium, arsenic, sulfur, silicon, phosphorous, and oxygen. Advantageously, the particular alloy selected should be capable of assuming at least two generally stable states in response to a stimulus, for a binary memory, and capable of assuming multiple generally stable states in response to a stimulus, for a higher order memory. Generally speaking, the stimulus will be an electrical signal, and the multiple states will be different states of crystallinity having varying levels of electrical resistance. Alloys that may be particularly advantageous include tellurium, antimony, and germanium having approximately 55 to 85 percent tellurium and 15 to 25 percent germanium, such as $Te_{56} Ge_{22} Sb_{22}$.

Referring next to block 142 and FIG. 21, a second insulating layer 122 is formed over the structure. In general, the thickness of the second insulating layer 122 is one to two times the depth of the contact hole 114 for shallow contact holes. The same materials used to form the first insulating layer 110 may also be used to form the second insulating layer 122.

The second insulating layer 122 and the memory film 118 are removed from the surface of the first insulating layer 110 to form an annular memory element 124, as may be seen from a study of block 144 and FIGS. 22 and 23. The second insulating layer 122 and the memory film 118 may be removed by any suitable process, such as an etching process, CMP process, or combination thereof, to expose the annular memory element 124.

Figure 25:
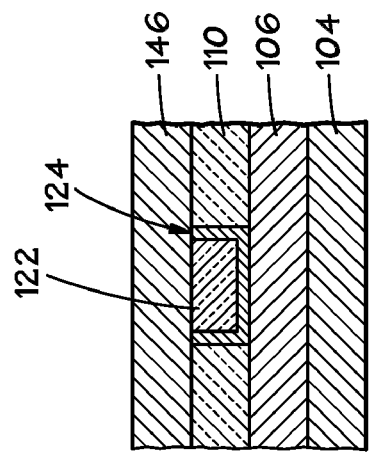
FIG. 25 illustrates an alternative embodiment.

In this case, the conductive layer 106 serves as the bottom electrode of the chalcogenide memory element. Therefore, a second conductive layer or line 146 may be deposited over the annular memory element 124, as illustrated in FIG. 25. In this example, the volume of the memory film 118 is controlled well (possibly even better than in the prior embodiment), as is the contact area between the annular memory element 124 and the second conductive layer 146. Thus, an array of such memory elements should contain a plurality of reproducible memory cells with very uniform active regions. In view of current theory, such memory cells should operate in a uniform manner suitable for a modern high density semiconductor memory.

To this point the discussion has centered around circular and annular contact areas. However, many of the advantages that annular contact areas have as compared with circular contact areas may also be exhibited by contact areas having different shapes. For instance, linear contact areas and hollow rectangular contact areas, as well as contact areas having various other hollow geometric shapes, may be fabricated to control the contact area and/or the volume of the memory material more precisely than known methods. For example, a hollow rectangular contact area may be formed in virtually the same manner as described above with reference to FIGS. 16-25, the only major difference being that the window 114 should be patterned in a rectangular rather than a circular shape.

The formation of linear contact areas, on the other hand, may benefit from the following additional discussion which refers to FIGS. 26-33. In this discussion, it should be understood that the structures illustrated in FIGS. 26-33 may be formed using the materials and fabrication techniques described above. Therefore, these details will not be repeated.

Figure 27:
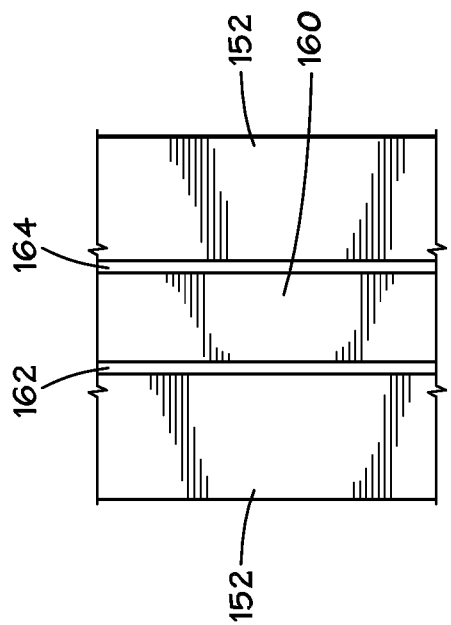

Rather than patterning a discrete window in an insulating layer, as illustrated in FIG. 19, a trench 150 may be patterned in a first insulating layer 152. As in the earlier embodiment, the first insulating layer 152 is disposed over a conductive layer 154 which is disposed on a substrate 156. As can be seen in FIG. 27, a thin film 158 is disposed over the insulating layer 152 and the trench 150. As before, the thickness of the film 158 is advantageously small compared to the width of the trench 150.

As in the previous embodiment, the film 158 may be a conductive material, if a linear electrode is to be formed, or the film 158 may be a structure changing memory material, such as chalcogenide, if a linear memory element is to be formed. Again, for the purpose of clarity, the formation of a linear electrode will first be discussed, followed by a discussion of the formation of a linear memory element.

If the film 158 is a conductive material, as described previously, a second insulating layer 160 is formed over the structure. In general, the thickness of the second insulating layer 160 is one to two times the depth of the trench 150 for shallow trenches. The second insulating layer 160 and the conductive film 158 are removed from the surface of the first insulating layer 152 to form two linear electrodes 162 and 164, as may be seen from a study of FIGS. 28 and 29.

If the linear electrodes 162 and 164 are to be used as the bottom electrodes for chalcogenide memory elements, the remainder of the memory cell is created. To create a memory cell, a layer of chalcogenide 166 may be deposited over the linear electrodes 162 and 164, and another conductive layer 168 may be deposited over the layer of chalcogenide 166. Then, the layers 166 and 168 may be patterned to create linear features that are perpendicular to the linear electrodes 162 and 164, as illustrated in FIGS. 30 and 31. These features may have a width at or below the photolithographic limit. It should be noted that the patterned conductive layers 168 form word lines (the digit lines being formed in the substrate 156) which are perpendicular to the linear electrodes 162 and 164 to create an array of addressable memory cells. It should also be noted that the portions of the linear electrodes 162 and 164 between the patterned conductive layers 168 may be removed, or otherwise processed, to make each cell electrically distinct.

In this example, the contact area between the linear electrodes 162 and 164 and the layer of chalcogenide 166 is controlled well and can be smaller than an annular contact area. Furthermore, an active region in the layer of chalcogenide 166 can have less volume than the blanket layer of chalcogenide 130 discussed previously. Thus, an array of such memory cells should contain a plurality of reproducible memory elements with small, uniform active regions. In view of current theory, such memory cells should operate in a uniform manner suitable for a modern high density semiconductor memory.

Now, referring back to FIG. 27, the formation of a linear memory element will be discussed using the same reference numerals occasionally to refer to different materials than those discussed above for purposes of clarity. For instance, instead of the film 158 being composed of a conductive material, as discussed above, the film 158 may be composed of a structure changing memory material. Such memory material may be chalcogenide or any other suitable memory material. Such memory material should also be suitable for conformal deposition in the trench 150 and demonstrate good adhesion properties for a subsequently formed insulating layer.

Figure 28:
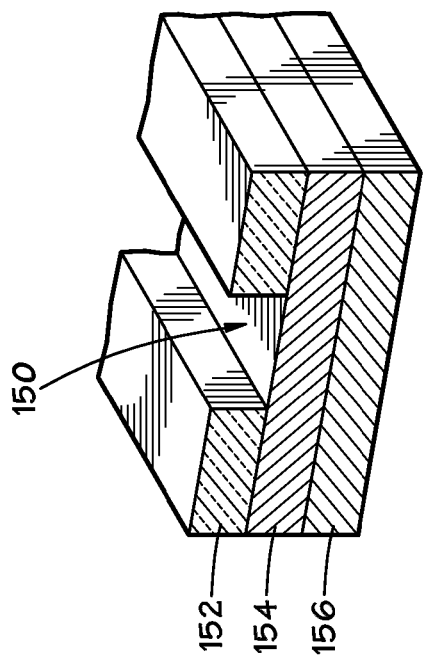
Figure 29:
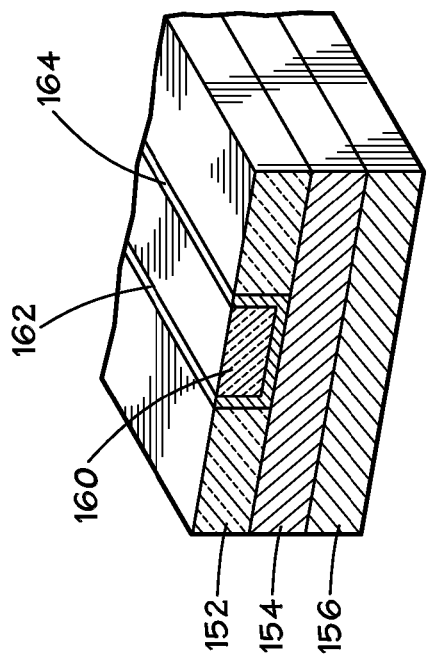

Referring next to FIGS. 28 and 29, a second insulating layer 160 is formed over the structure, and the second insulating layer 160 and the memory film 158 are removed from the surface of the first insulating layer 152 to form two linear memory elements 162 and 164. In this case, the conductive layer 154 serves as the bottom electrode of the chalcogenide memory element. Therefore, a second conductive layer 170 may be deposited over the linear memory elements 162 and 164 and etched to form conductive lines substantially perpendicular to the linear memory elements 162 and 164, as illustrated in FIGS. 32 and 33. As in the previous embodiment, the portions of the linear memory elements 162 and 164 between the conductive layers 170 may be removed, or otherwise processed, to make each memory cell electrically distinct. In this example, the volume of the memory film 158 is controlled well, as is the contact area between the linear memory elements 162 and 164 and the second conductive layer 170. Thus, an array of such memory elements should contain a plurality of reproducible memory cells with small and very uniform active regions. In view of current theory, such memory cells should operate in a uniform manner suitable for a modern high density semiconductor memory.

It should be recognized that methods of fabricating contact structures other than the methods described above may be utilized to fabricate similar contact structures. For instance, a "facet etch" process may be utilized to create similar contact structures without using a CMP process which may be damaging to the chalcogenide material or to the small features of the contact structure. Indeed, a facet etch process can create structures that are difficult, if not impossible, to make using CMP. An example of a facet etch process is described below with reference to FIGS. 34-41. In this discussion, it should be understood that the structures illustrated in FIGS. 34-41 may be formed using the materials and fabrication techniques described above, except as stated otherwise. Therefore, these details will not be repeated.

Figure 34:
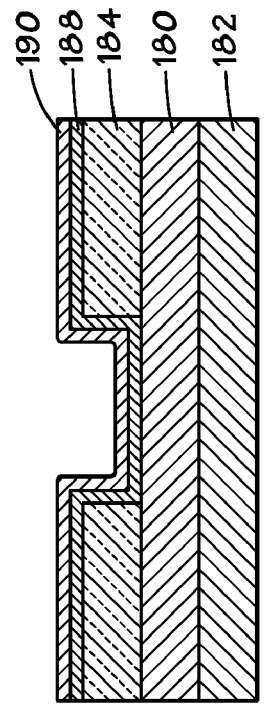

As illustrated in FIG. 34, a structure similar to the initial structure of the previous embodiments is formed. Specifically, a conductive layer 180 is deposited over a substrate 182. A first insulating layer 184 is deposited over the conductive layer 180, and a window or trench 186 is formed in the first insulating layer 184. Then, a conformal second conductive layer 188 is deposited over the first insulating layer 184 and over the window or trench 186.

Figure 35:
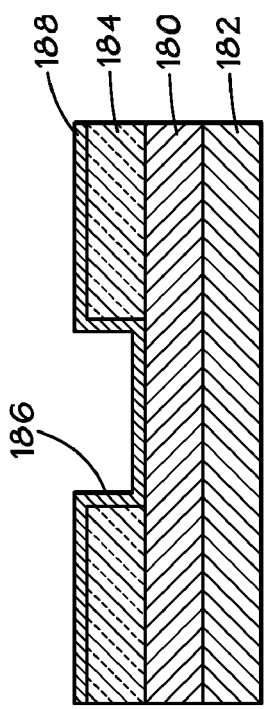
Figure 36:
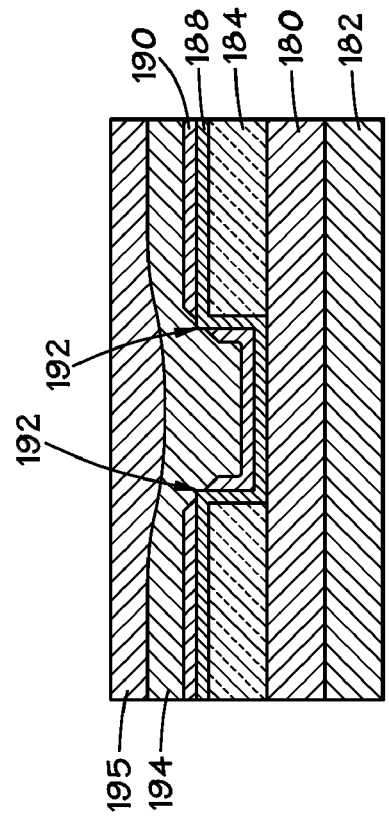

Unlike the previously described embodiments, a thin conformal second insulating layer 190 is deposited over the conformal second conductive layer 188, as illustrated in FIG. 35. A facet etch is then performed to remove portions of the second insulating layer 190 at the edges 192 of the window or trench 186, as shown in FIG. 36. A facet etch using an argon etchant, for example, can remove the second insulating layer 190 from the edges 192 at a rate up to four times that which is removed at the planar surfaces. It should be noted that this process leaves the second layer of insulating material 190 on the vertical and horizontal surfaces of the window or trench 186. Thus, the facet etch creates a geometric contact, such as an annular or rectangular contact, if the feature 186 is a window, and it creates a linear contact is the feature 186 is a trench.

Figure 37:
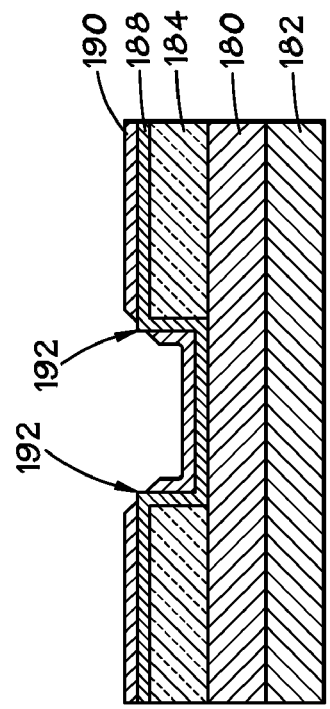

Once the second conductive layer 188 is exposed at the edges 192, subsequent layers may be deposited to complete a circuit. For example, the window or trench 186 may be filled with a layer of chalcogenide 194, as shown in FIG. 37. Note that contact between the chalcogenide layer 194 and the second conductive layer 188 occurs only at the edges 192. An upper electrode of conductive material 195 and other features may be formed over the layer of chalcogenide 194 to complete the memory cell and memory array.

Alternatively, as with the previous embodiments, the layer 188 illustrated in FIGS. 34-37 may be a layer of structure changing material, such as chalcogenide. In this case, the facet etch removes the edges of the second insulating layer 190 to expose the corners 192 of the chalcogenide layer 188. Accordingly, rather than filling the window or trench 186 with a layer of chalcogenide material, a second conductive layer 196 is deposited, as illustrated in FIG. 38. As before, other features may be formed on the second conductive layer 196 to finish the circuit.

It should be further appreciated that the facet etch process just described may be used on protruding features, as well as the window or trench 186. In contrast, the CMP process probably cannot be used on protruding features with much success, and the CMP process may also have problems with trenches and other large shapes. As illustrated in FIG. 39, a protruding feature 200 may be formed on a substrate 202. As with the embodiments described above, the substrate 202 may contain features or circuitry, such as an access device. In one example, the protruding feature 200 may be a conductive pillar or line, depending on whether a geometric or linear contact is desired. A conformal insulating layer 204 is deposited over the conductive pillar or line 200, and a facet etch is performed to remove the edges of the insulating layer to expose the edges 206 of the conductive pillar or line 200, as illustrated in FIG. 40. Once the edges 206 of the conductive pillar or line 200 have been exposed to form a contact, a layer of chalcogenide 208 may be formed over the structure, as illustrated in FIG. 41. To complete the memory cell, a second layer of conductive material 210 may be formed over the chalcogenide layer 208.

Of course, the protruding feature 200 may be a chalcogenide pillar or line. In this example, the substrate 202 may also include a conductive layer or layers which form the bottom electrode of a chalcogenide memory cell. Accordingly, after the insulating layer 204 has been deposited and the edges removed to expose the edges 206 of the chalcogenide pillar or line 200, the layer 208 may be formed using a conductive material or materials to complete the memory cell and the layer 210 of FIG. 41 may be omitted.

Figure 42:
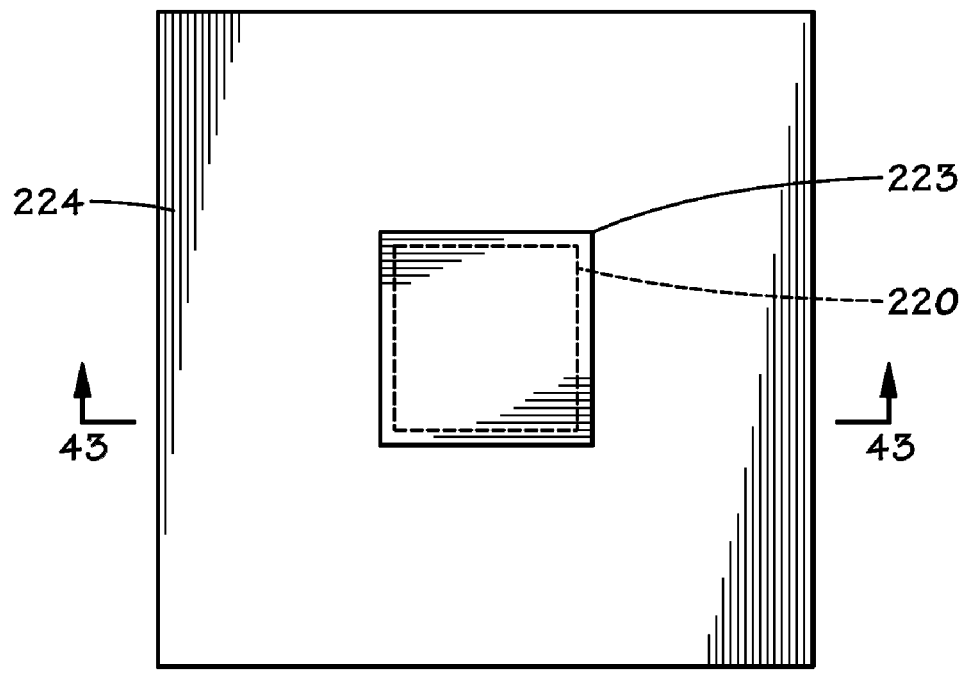
FIGS. 42-46 illustrate the formation of a second electrode embodiment using facet etch processes.
Figure 43:
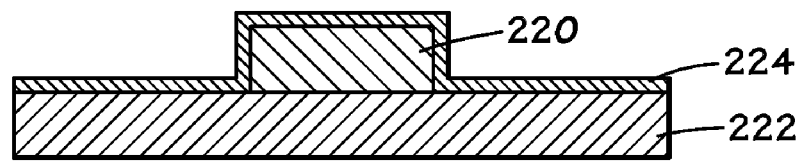
Figure 44:
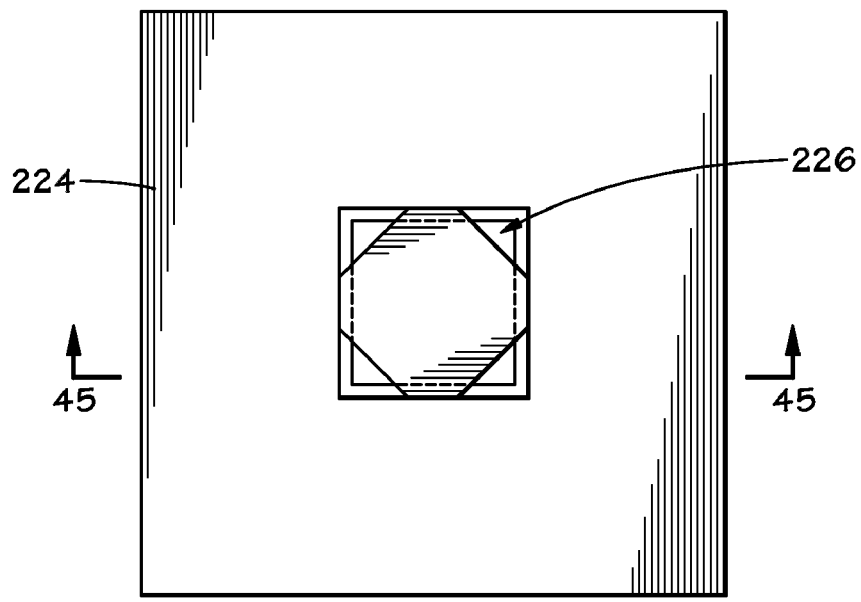
Figure 45:
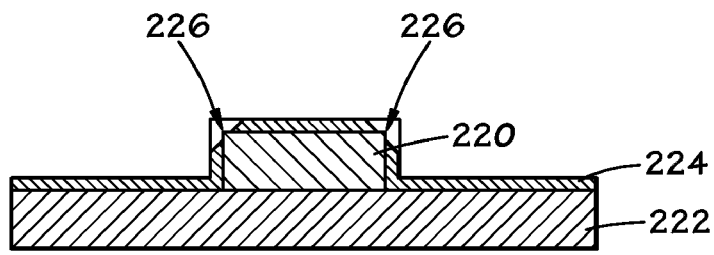

In addition to forming geometric or linear contacts, the facet etch process may also be utilized to form point contacts. As illustrated in FIGS. 42 and 43, a protruding feature 220 may be formed on a substrate 222. As with the embodiments described above, the substrate 222 may contain features or circuitry, such as an access device. In one example, the protruding feature 220 may be a conductive pillar. Advantageously, the conductive pillar has a shape with one or more corners 223, such as a square or rectangular shape. A conformal insulating layer 224 is deposited over the conductive pillar 220, and a facet etch is performed to remove the corners of the insulating layer to expose the corners 226 of the conductive pillar 220, as illustrated in FIGS. 44 and 45. If the conductive pillar 220 has a square or rectangular shape, the exposed corners 226 of the conductive pillar 220 form four point contacts.

Figure 46:
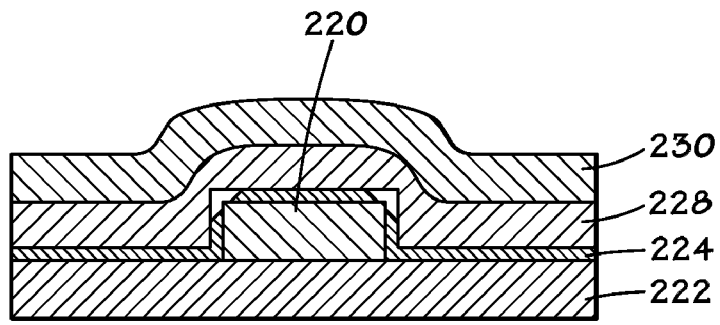

It should be appreciated that one, two, or four memory cells may be fabricated using the four contact points. As a first example, each point contact may be utilized in an individual memory cell. In other words, chalcogenide material (as described in conjunction with the previous embodiments) may be formed over each of the four point contacts to create four separate memory cells, each with its own set of bit lines. As a second example, if the four point contacts are sufficiently closed to one another, all four point contacts may be covered with chalcogenide material and used in a single memory cell. As illustrated in FIG. 46, a layer of chalcogenide 228 may be formed over the structure, and a second layer of conductive material 230 may be formed over the chalcogenide layer 228 to complete the memory cell. As a third example, two of the four point contacts may be used in a first memory cell and the other two of the four point contacts may be used in a second memory cell. In this example, it may be particularly useful to use a rectangular pillar 220 so that one pair of point contacts is sufficiently spaced from the other pair of point contacts to facilitate chalcogenide coverage of each respective pair of point contacts, as well as to facilitate the provision of separate sets of bit lines for each pair of point contacts.

Of course, the protruding feature 220 may be a chalcogenide pillar. In this example, the substrate 222 may also include a conductive layer or layers which form the bottom electrode of a chalcogenide memory cell. Accordingly, after the insulating layer 224 has been deposited and the corners removed to expose the corners 226 of the chalcogenide pillar 220. As described above, for a chalcogenide pillar 220 that yields four point contacts, one, two, or four memory cells may be fabricated. Using the second example above in which a single memory cell is fabricated using four point contacts, the layer 228 may be formed using a conductive material or materials to complete the memory cell and the layer 230 of FIG. 46 may be omitted.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A semiconductor device comprising:
   a first conductive layer;
   a first insulative layer disposed on the first conductive layer, wherein the first insulative layer comprises a contact structure formed therethrough, the contact structure exposing the first conductive layer;
   a second conductive layer disposed on the first insulative layer and on the first conductive layer in the contact structure, the second conductive layer comprising at least one of titanium nitride, titanium, aluminum, tungsten, tungsten silicide, and copper;
   a second insulative layer disposed on the second conductive layer and in the contact structure, wherein the second insulative layer comprises openings to expose portions of the second conductive layer; and
   a conductive material disposed on the second insulative layer and in the contact structure, wherein the conductive material is in direct contact with the exposed portions of the second conductive layer.

2. The memory device of claim 1, wherein the exposed portions of the second conductive layer form an annular contact.

3. The memory device of claim 1, wherein the first conductive layer comprises a lower electrode.

4. The memory device of claim 1, wherein the second conductive layer comprises an upper electrode.

5. A semiconductor device comprising:
   a first conductive layer disposed on a substrate;
   a first insulative layer disposed on the first conductive layer, wherein the first insulative layer comprises a contact structure formed therethrough, a portion of the first conductive layer being exposed through an opening in the contact portion;
   a second conductive layer disposed on the first insulative layer and the exposed portion of the first conductive layer; and
   a second insulative layer disposed on the second conductive layer in the contact structure, wherein the second insulative layer comprises openings to expose portions of the second conductive layer.

6. The semiconductor device of claim 5, wherein the first conductive layer comprises a titanium nitride layer and a carbon layer deposited on the titanium nitride layer.

7. The semiconductor device of claim 5, wherein the first insulative layer comprises boron and phosphorous doped silicon dioxide glass (BPSG).

8. The semiconductor device of claim 5, wherein the contact structure comprises a depth and a diameter, and wherein the depth is greater than the diameter.

* * * * *